(12) United States Patent
Morning-Smith et al.

(10) Patent No.: US 10,405,420 B2
(45) Date of Patent: Sep. 3, 2019

(54) GULLWING PCB STRUCTURE TO ENABLE HIGH FREQUENCY OPERATION

(71) Applicant: INTEL CORPORATION, Santa Clara, CA (US)

(72) Inventors: Andrew Morning-Smith, Vancouver (CA); Eugene Lim, Vancouver (CA); Meng Zhai, Richmond (CA)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/218,344

(22) Filed: Dec. 12, 2018

(65) Prior Publication Data

US 2019/0116660 A1   Apr. 18, 2019

(51) Int. Cl.
*H05K 1/02* (2006.01)
*H05K 3/46* (2006.01)
*H05K 1/18* (2006.01)

(52) U.S. Cl.
CPC ............ *H05K 1/028* (2013.01); *H05K 1/189* (2013.01); *H05K 3/4691* (2013.01); *H05K 2201/10159* (2013.01)

(58) Field of Classification Search
CPC ...... H05K 1/028; H05K 1/189; H05K 3/4691; H05K 2201/10159; H05K 1/147
USPC .......................................... 174/254; 361/749
See application file for complete search history.

(56) References Cited

U.S. PATENT DOCUMENTS

| | | | | |
|---|---|---|---|---|
| 2008/0093110 A1* | 4/2008 | Bagung | ................ | H05K 1/0278 174/254 |
| 2014/0295921 A1* | 10/2014 | Kato | .................... | H04M 1/026 455/575.1 |
| 2015/0156879 A1* | 6/2015 | Pouget | ................... | H05K 1/148 361/749 |
| 2015/0351233 A1* | 12/2015 | Peterson | .............. | H05K 1/0278 361/785 |

OTHER PUBLICATIONS

Alcorn, P., "SanDisk Opens up 4TB SSD Behemoth Optimus MAX for Inspection", [online], Jun. 5, 2014, [Retrieved on Mar. 12, 2019], Retrieved from the Internet at <URL: https://www.tweaktown.com/news/38249/sandisk-opens-up-4tb-ssd-behemoth-optimus-max-for-inspection/index.html>, 3 pp.

(Continued)

*Primary Examiner* — Sherman Ng
(74) *Attorney, Agent, or Firm* — Konrad Raynes Davda & Victor LLP; Alan S. Raynes

(57) ABSTRACT

Embodiments include devices and method related to a foldable printed circuit board that may be used in SSD applications. One embodiment relates to a foldable printed circuit board comprising a first rigid portion, a second rigid portion, and a first flexible region coupling the first rigid portion to the second rigid portion. The foldable printed circuit board also includes a third rigid portion and a second flexible region coupling the second rigid portion to the third rigid portion, wherein the first rigid portion and the third rigid portion each have a width that is less than that of the second rigid portion. Other embodiments are described and claimed.

19 Claims, 3 Drawing Sheets

(56) References Cited

OTHER PUBLICATIONS

Chiapetta, M., "Intel SSD DC P4510 NVMe PCIe Review: Blistering 3GB/s Transfers, With Low Latency", [online], Mar. 14, 2018, [Retrieved on Mar. 12, 2019], Retrieved from the Internet at <URL: https://hothardware.com/reviews/intel-ssd-dc-p4510-nvme-pcie-review?page=1>, <same URL but with page=2>, <same URL but with page=3>, <same URL but with page=4>, <same URL but with page=5>, <same URL but with page=6, <same URL but with page=7>, 33 pp.

Kennedy, P., "First Look: Inside a 2.5" SFF Intel DC P3700 400GB Drive, [online], Nov. 20, 2014, [Retrieved on Mar. 12, 2019], Retrieved from the Internet at <URL: https://www.servethehome.com/2-5-sff-intel-dc-p3700-400gb-drive/>, 5 pp.

\* cited by examiner

GULLWING PCB STRUCTURE TO ENABLE HIGH FREQUENCY OPERATION

TECHNICAL FIELD

Embodiments described herein generally relate to devices and methods including a foldable printed circuit board that may be positioned in an enclosure and used for applications such as SSDs (solid state drives).

BACKGROUND

As host bandwidth increases, the ability to provide increased frequency operation of devices such as SSDs is also needed. A printed circuit board (PCB) used in an SSD typically includes a controller and a plurality of memory chips positioned thereon. Other components such as power circuitry and a connector for coupling the SSD to a computing system may also be positioned on the PCB. The SSD PCB may be positioned in an enclosure.

BRIEF DESCRIPTION OF THE DRAWINGS

Embodiments are described by way of example, with reference to the accompanying drawings, in which like reference numerals may refer to similar elements.

DESCRIPTION OF EMBODIMENTS

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment.

Figure 1:
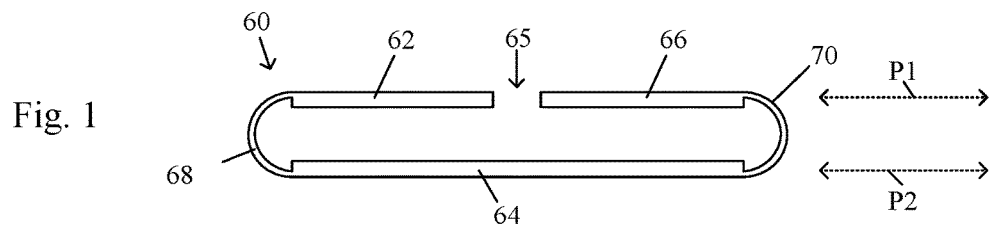
FIG. 1 illustrates a cross-sectional view of a folded PCB structure in accordance with certain embodiments.
Figure 2:
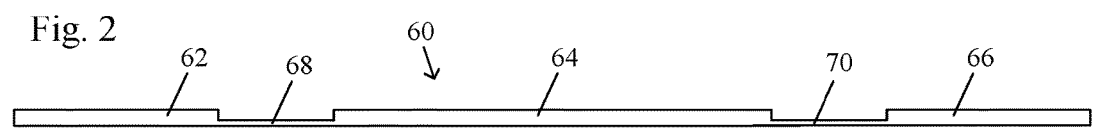
FIG. 2 illustrates a cross-sectional view of the PCB structure of FIG. 1 in an unfolded state, in accordance with certain embodiments.

Certain embodiments relate to foldable PCBs that may be used for applications such as SSDs. FIGS. 1-2 illustrate a foldable PCB 60 embodiment that provides advantages over other PCB structures. FIG. 1 shows the PCB 60 in a folded state, and FIG. 2 shows the PCB 60 in an unfolded state.

As illustrated in FIG. 2, the PCB 60 may include a rigid end portion 62 on the left side of the figure, a rigid middle portion 64 in a middle part of the figure, and a rigid end portion 66 on the right side of the figure. A flexible region 68 extends between the rigid end portion 62 and the rigid middle portion 64, and a flexible region 70 extends between the rigid middle portion 64 and the rigid end portion 66. The rigid end portion 62 may be considered a first rigid end portion, the rigid middle portion 64 may be considered a second rigid portion, and the rigid end portion 66 may be considered a third rigid portion of the PCB 60. Likewise, the flexible region 68 may be considered a first flexible region and the flexible region 70 may be considered a second flexible region. Depending on the how the relationship between the various rigid portions and flexible regions is defined, the numbering scheme (e.g., which is labeled first, second, and third) may be varied. A plurality of components may be positioned on the PCB 60 at locations including, but not limited to, the upper and lower surfaces of the rigid end portion 62, the rigid middle portion 64, and the rigid end portion 66.

As illustrated in FIG. 1, the flexible regions 68, 70 and the rigid end portions 62, 66 are positioned in a gullwing type of configuration with the flexible regions 68, 70 each bent upward into an arc-like shape and rigid end portions 62, 66 positioned over the rigid middle portion 64. FIG. 1 shows a two level PCB structure, with one level including the rigid end portions 62, 66 and the other level including the rigid middle portion 64. The rigid end portions 62, 66 may be positioned along a common plane, as indicated by the dotted line P1 in FIG. 2. The common plane P1 of the rigid end portions 62, 66 is spaced a distance away from the plane P2 that the rigid middle portion 64 extends along. As illustrated in the embodiment of FIG. 1, the common plane P1 that rigid end portions 62, 66 are positioned on may be substantially parallel to the plane P2 that the rigid middle portion 64 is positioned along. Embodiments may include a small variance in the size and position of any of the rigid portions 62, 64, 66 so long as undesirable interactions between components mounted on the various surfaces are minimized or avoided. If the variance is too great, then components positioned on the various surfaces may come into contact with the enclosure, other components, or the PCB itself.

In certain embodiments, the rigid end portions are sized and positioned so that there is no overlap over the rigid middle portion. Such configuration minimizes the chances of undesirable interactions between the various surfaces and components. For example, as seen in FIG. 1, the rigid end portion 62 and the rigid end portion 66 are positioned over the rigid middle portion 64 so that the rigid end portion 62 and the rigid end portion 66 do not overlap one another over the rigid middle portion 64 at any location orthogonal to the rigid middle portion 64. In addition, in certain embodiments, the rigid end portion 62 may have a width that is equal to the width of the end portion 66, and the flexible portion 68 may have a width that is equal to the width of flexible portion 70.

The PCB 60 may be formed from any suitable material including, but not limited to, polyimide, FR-4 (glass-reinforced epoxy laminate), and resin coated copper. The PCB 60 may be a multilayer structure with the flexible regions 68, 70 having a thickness that is less than that of the rigid portions 62, 64, 66. As illustrated in FIG. 2, the flexible regions 68, 70 are connected (or integral) to a lower part of the rigid portions 62, 64, 66. In other embodiments the connection between the flexible regions and the rigid portions may be at another vertical location, such as at an upper part or a middle part of the rigid portions.

In certain embodiments the size of the PCB is such that the width of each of the rigid end portions is less than the width of the rigid middle portion. As seen in FIG. 1, for example, certain embodiments include the rigid end portions 62, 66 each having a width that is less than half the width of the rigid middle portion 64. This is so that when folded over, there is space for the rigid end portions 62, 66 to fit without contacting one another, and for the entire PCB 60 to fit within a suitable enclosure such as, for example, a standard U.2 (15 mm) enclosure.

Figure 3:
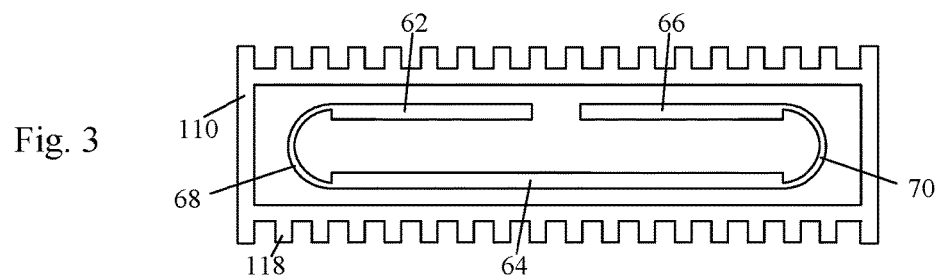
FIG. 3 illustrates the PCB structure of FIG. 1 in an enclosure, in accordance with certain embodiments.

FIG. 3 illustrates the PCB 60 of FIGS. 1-2 positioned in an SSD enclosure 110. The enclosure 110 may include a plurality of fins 118 for heat dissipation. The two row configuration of the PCB 60, with the top row including the rigid end portions 62, 66 and the bottom row including rigid middle portion 64, permits adequate space for the enclosure 110 to be formed to include the fins 118, within accepted form factor dimensions, including, but not limited to, a 2.5 inch form factor, which may include a width of about 70 mm, a depth of about 100 mm, and a height of about 15 mm. It is further noted that the structure, as illustrated in FIG. 1, for example, includes a space or opening 65 between the rigid end portion 62 and the rigid end portion 66, positioned above the center of the rigid middle portion 64. Such positioning of the opening 65 allows for desirable heat dissipation, because heat generated towards the sides of the structure may be able to escape through the opening 65 near the center of the structure.

Figure 4:
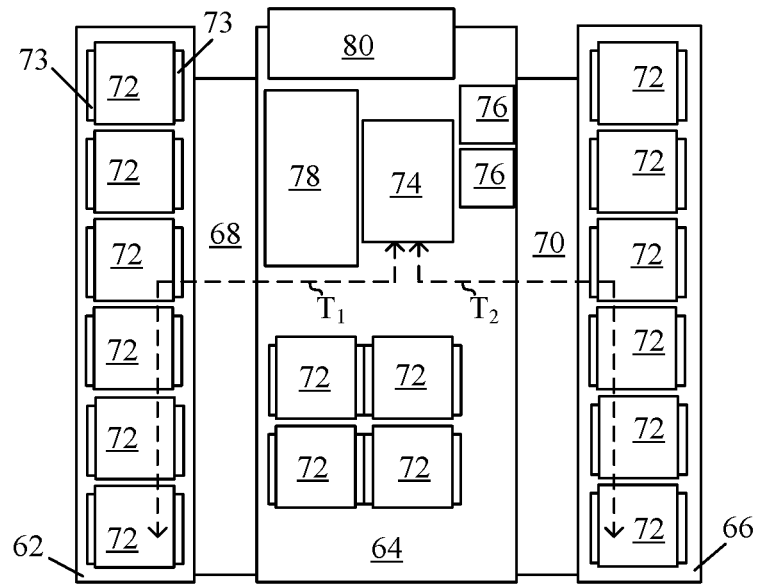
FIG. 4 illustrates a PCB structure including a plurality of components positioned thereon, in accordance with certain embodiments.

FIG. 4 illustrates an example of PCB 60 with a plurality of SSD components positioned thereon, in accordance with certain embodiments. Rigid end portions 62 and 66 each include a plurality of memory chips 72 mounted thereon. Memory chips 72 may include, but are not limited to, memory structures comprising a single chip or multiple chips in a package. The memory chips 72 may be coupled to passives 73 such as capacitors and resistors. A variety of memory chip (media) types may be utilized in embodiments, including, but not limited to, solid state memory (such as planar or 3D NAND flash memory or NOR flash memory), three dimensional crosspoint memory, magnetoresistive random access memory (MRAIVI), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. Certain of the memory types listed above may overlap with other memory types listed.

Rigid middle portion 64 includes a number of different components thereon, including, for example, additional memory chips 72 (and passives 73) like those found on the rigid end portions 62, 66, as well as an SSD controller 74 (which may be any suitable component, including, but not limited to, an ASIC (application specific integrated circuit)), RAM memory 76, power and support circuits 78, and a connector 80 such as a PCIe connector. Other features may also be present, including, but not limited to, debugging test points (not shown). The components may be positioned in locations including, but not limited to, the top and bottom surfaces of the PCB.

One or more advantages are found with a PCB layout in accordance with certain embodiments, such as that illustrated in FIG. 4. The embodiment seen in FIG. 4 includes one column of memory chips 72 on each of the rigid end portions 62, 66 (to the left and right of the rigid middle portion as seen in FIG. 4). This layout minimizes the distance between various components and the SSD controller 74. This means that the trace distance from the memory chips 72 to the SSD controller 74 can be minimized. FIG. 4 includes dotted lines $T_1$ and $T_2$ that each show a possible trace pathway from a bottom memory chip 72 on each of the rigid end portions 62, 66 to the SSD controller 74. Shortening the trace distance permits faster signal processing.

Positioning memory chips 72 to multiple sides of the controller chip 74 offers other advantages as well. By positioning the memory chips 72 as seen in FIG. 4, there are relatively few traces extending across the structure in any given area, which means that the spacing between adjacent traces can be increased, which results in less interference between traces and improved signal quality. Thus, positioning of columns of memory chips 72 to multiple sides of the SSD controller 74 leads to better performance by enabling shorter bus trace lengths and a greater spreading of the bus traces.

Figure 5:
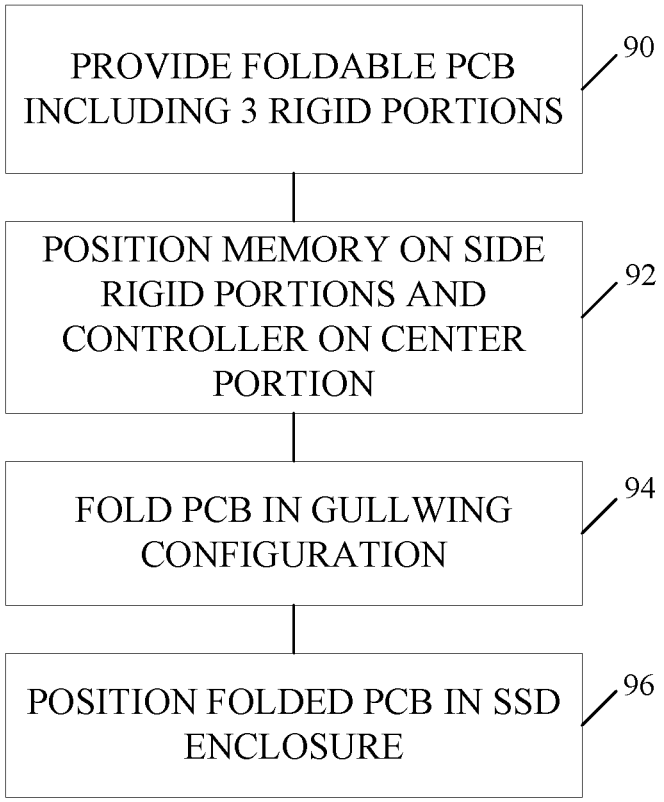
FIG. 5 illustrates a flowchart of operations in accordance with certain embodiments.

FIG. 5 illustrates a flowchart of operations in accordance with certain embodiments. Block 90 is providing a foldable PCB including three rigid portions. The three rigid portions may in certain embodiments include a structure similar to that illustrated in FIGS. 1-3, in which rigid end portions have a width that is less than one half the width of the rigid middle portion, so that the PCB can be folded in a gullwing configuration such as the embodiment illustrated in FIG. 1. Block 92 is positioning a plurality of memory modules on each of the end portions and an SSD controller on the middle portion. Other components may also be positioned on the PCB as desired. Box 94 is folding the PCB in a gullwing configuration such as, for example, illustrated in FIG. 1. Box 96 is positioning the folded PCB in an SSD enclosure. It will be understood that modifications to these operations may be made by one of ordinary skill.

Figure 6:
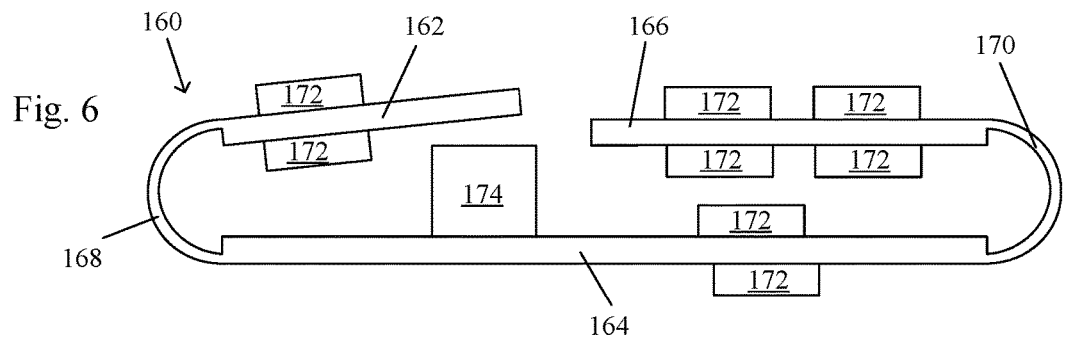
FIG. 6 illustrates a cross-sectional view of a folded PCB structure in accordance with certain embodiments.

Embodiments described herein and shown in the drawings are merely illustrative and not restrictive, and not restricted to the specific constructions and arrangements shown. A variety of modifications may be made to the various embodiments discussed herein. For example, FIG. 6 illustrates an embodiment showing a PCB 160 in a folded state including a plurality of components positioned thereon. The PCB 160 of FIG. 6 has a number of different features than those shown in the PCB 60 illustrated in FIG. 1, for example. The PCB 160 includes rigid end portions 162, 166 and flexible regions 168, 170 that are folded so that part of rigid end portion 162 is spaced apart from the rigid middle portion 164 a greater distance than the rigid end portion 166 is spaced apart from the rigid middle portion 164. In addition, as seen in FIG. 6, the rigid end portion 162 has a width that is shorter than the width of the rigid end portion 166. Depending on variables including, but not limited to, the dimensions of the specific components positioned on the various portions of the PCB and the size of the enclosure, the size (including, for example, width and thickness) and position of the various parts of the PCB may be varied. As illustrated in the embodiment of FIG. 6, a component 174, which may, for example, be a controller such as an SSD controller, may have a size that is different than that of components 172, which may, for example, be memory chips. The relatively large height of the component 174 leads to the rigid end portion 162 being angled upwards so that a sufficient clearance between the component 174 and the rigid end portion 162 is achieved. In addition, in certain embodiments, for spacing or other reasons, it may be desirable to provide a greater number of components on one portion of the PCB than on another portion. This is shown in the embodiment of FIG. 6, which includes a greater number of components 172 on the rigid end portion 166 than on the rigid end portion 162.

In addition, similar to the relationship described above in connection with FIG. 2, the embodiment illustrated in FIG. 6 includes the folded PCB 160 configured so that that the rigid end portion 162 and the rigid end portion 166 do not overlap one another over the rigid middle portion 164 at any location orthogonal to the rigid middle portion 164.

Figure 7:
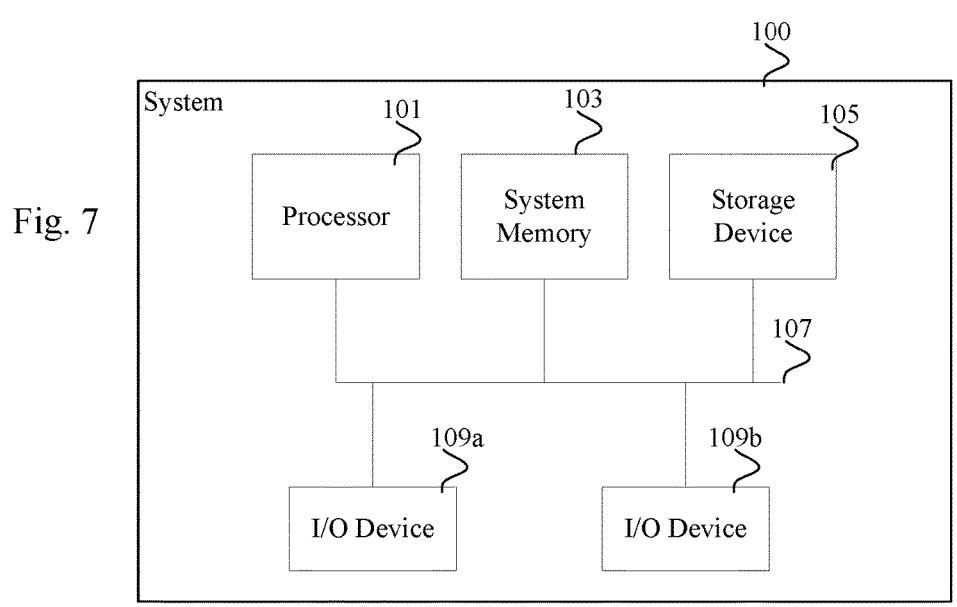
FIG. 7 illustrates an electronic system arrangement in which embodiments may find application.

Assemblies including components formed as described in embodiments above may find application in a variety of electronic devices. FIG. 7 illustrates an embodiment of a system 100 in which embodiments as described above may be utilized. The system 100 includes a processor 101 and system memory 103, which may, for example, comprise RAM memory. The system 100 may further include a mass storage device 105 for long-term storage. The mass storage device 105 may include a structure in accordance with embodiments as described herein, such as, for example, a foldable PCB having gullwing configuration such that the PCB 60 illustrated in FIG. 3. The system 100 may also communicate with Input/Output (I/O) devices 109a, 109b, which may comprise input devices, display devices, graphics cards, ports, network interfaces, etc. Other embodiments need not include all of the features specified in FIG. 7, and may include alternative features not specified in FIG. 7.

The system 100 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage device, network controller, router, etc.

Various features of embodiments described above may be implemented with respect to other embodiments, including apparatus and method embodiments. The order of certain operations as set forth in embodiments may also be modified. Specifics in the examples may be used anywhere in one or more embodiments.

The terms "a" and "an" mean "one or more", unless expressly specified otherwise. Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting.

Devices that are in communication with each other need not be in continuous communication with each other, unless expressly specified otherwise. In addition, devices that are in communication with each other may communicate directly or indirectly through one or more intermediaries. A description of an embodiment with several components in communication with each other does not imply that all such components are required. Embodiments may be manufactured, used, and contained in a variety of positions and orientations.

In the present description, various features are sometimes grouped together in a single embodiment, figure, or description thereof for the purpose of streamlining the disclosure and aiding in the understanding of one or more of the various inventive aspects. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment. Thus the claims are hereby incorporated by reference into this detailed description.

EXAMPLES

The following examples relate to various embodiments. Specifics in the examples may be used anywhere in one or more embodiments.

Example 1 is a foldable printed circuit board comprising: a first rigid portion; a second rigid portion; a first flexible region coupling the first rigid portion to the second rigid portion; a third rigid portion; and a second flexible region coupling the second rigid portion to the third rigid portion; wherein the first rigid portion and the third rigid portion each have a width that is less than that of the second rigid portion.

In Example 2, the subject matter of Examples 1 and 3-5 can optionally include wherein the first rigid portion and the third rigid portion each have a width that is less than one half that of the second rigid portion.

In Example 3, the subject matter of Examples 1-2 and 4-5 can optionally include a plurality of memory chips positioned on each of the first rigid portion and the third rigid portion.

In Example 4, the subject matter of Examples 1-3 and 5 can optionally include wherein the second rigid portion includes a solid state drive (SSD) controller positioned thereon.

In Example 5, the subject matter of Examples 1-4 can optionally include an SSD including the foldable printed circuit board of claim 1.

Example 6 is A solid state drive (SSD) comprising: an enclosure; a folded printed circuit board comprising a first rigid portion, a second rigid portion, a first flexible region coupling the first rigid portion to the second rigid portion, a third rigid portion, a second flexible region coupling the second rigid portion to the third rigid portion, wherein the first rigid portion and the third rigid portion are positioned over the second rigid portion so that the first rigid portion and the third rigid portion do not overlap one another over the second rigid portion at any location orthogonal to the second rigid portion; and an enclosure into which the folded printed circuit board is positioned.

In Example 7, the subject matter of Examples 6 and 8-11 can optionally include wherein the first rigid portion and the third rigid portion of the folded printed circuit board each have a width that is less than one half that of the second rigid portion.

In Example 8, the subject matter of Examples 6-7 and 9-11 can optionally include wherein a gap is located between the first rigid portion and the third rigid portion over the second rigid portion.

In Example 9, the subject matter of Examples 6-8 and 10-11 can optionally include a plurality of memory chips positioned on each of the first rigid portion and the third rigid portion of the folded printed circuit board, and an SSD controller positioned on the second rigid portion of the folded printed circuit board.

In Example 10, the subject matter of Examples 6-9 and 11 can optionally include wherein the first rigid portion and the third rigid portion are positioned along a common plane that is different than a plane the second rigid portion is positioned along.

In Example 11, the subject matter of Examples 6-10 can optionally include wherein the first rigid portion and the second rigid portion of the folded printed circuit board are positioned directly over the second rigid portion.

Example 12 is a folded printed circuit board comprising: a first rigid portion; a second rigid portion; a first flexible region coupling the first rigid portion to the second rigid portion; a third rigid portion; and a second flexible region coupling the second rigid portion to the third rigid portion; wherein the first rigid portion and the third rigid portion are positioned over the second rigid portion so that the first rigid portion and the third rigid portion do not overlap one another over the second rigid portion at any location orthogonal to the second rigid portion.

In Example 13, the subject matter of Examples 12 and 14-17 can optionally include wherein the first rigid portion and the third rigid portion of the folded printed circuit board each have a width that is less than one half that of the second rigid portion.

In Example 14, the subject matter of Examples 12-13 and 15-17 can optionally include a plurality of memory chips positioned on each of the first rigid portion and the third rigid portion of the folded printed circuit board, and an SSD controller positioned on the second rigid portion.

In Example 15, the subject matter of Examples 12-14 and 16-17 can optionally include wherein the first rigid portion and the third rigid portion are positioned along a common plane that is different than a plane the second rigid portion is positioned along.

In Example 16, the subject matter of Examples 12-15 and 17 can optionally include wherein a gap is located between the first rigid portion and the third rigid portion over the second rigid portion.

In Example 17, the subject matter of Examples 12-16 can optionally include wherein the first rigid portion and the second rigid portion are both positioned directly over the second rigid portion.

Example 18 is a method for forming an electronic device, comprising: providing a printed circuit board including a first rigid portion, a second rigid portion, a first flexible region coupling the first rigid portion to the second rigid portion, a third rigid portion, and a second flexible region coupling the second rigid portion to the third rigid portion; folding the printed circuit board so that the first rigid portion and the third rigid portion are positioned over the second rigid portion so that the first rigid portion and the third rigid portion do not overlap one another over the second rigid portion at any location orthogonal to the second rigid portion; and positioning the folded printed circuit board into an enclosure.

In Example 19, the subject matter of Examples 18 and 20-24 can optionally include providing an SSD controller on the second rigid portion and a plurality of memory chips on the first rigid portion and the third rigid portion.

In Example 20, the subject matter of Examples 18-19 and 21-24 can optionally include configuring the first rigid portion and the third rigid portion to each have a width that is less than one half that of the second rigid portion.

In Example 21, the subject matter of Examples 18-20 and 22-24 can optionally include providing a gap between the first rigid portion and the second rigid portion over the second rigid portion.

In Example 22, the subject matter of Examples 18-21 and 23-24 can optionally include wherein the folding the printed circuit board further includes positioning the first rigid portion and the third rigid portion directly over the second rigid portion.

In Example 23, the subject matter of Examples 18-22 and 24 can optionally include positioning the first rigid portion and the third rigid portion along a common plane that is different than a plane the second rigid portion is positioned along.

In Example 24, the subject matter of Examples 18-23 can optionally include positioning an equal number of memory chips on the first rigid portion and on the third rigid portion.

Example 25 is an apparatus comprising means to perform a method as claimed in any preceding claim.

Example 26 is machine-readable storage including machine-readable instructions, when executed, to implement a method or realize an apparatus as claimed in any preceding claim.

What is claimed:

1. A foldable printed circuit board comprising:
   a first rigid portion;
   a second rigid portion;
   a first flexible region coupling the first rigid portion to the second rigid portion;
   a third rigid portion;
   a second flexible region coupling the second rigid portion to the third rigid portion;
   wherein the first rigid portion and the third rigid portion each have a width that is less than one half that of the second rigid portion; and
   wherein when the foldable printed circuit board is folded, the first rigid portion and the third rigid portion are positioned over the second rigid portion so that the first rigid portion and the third rigid portion do not overlap one another over the second rigid portion at any location orthogonal to the second rigid portion.

2. The foldable printed circuit board of claim 1, further comprising a plurality of memory chips positioned on each of the first rigid portion and the third rigid portion.

3. The foldable printed circuit board of claim 2, wherein the second rigid portion includes a solid state drive (SSD) controller positioned thereon.

4. An solid state drive (SSD) including the foldable printed circuit board of claim 1.

5. A solid state drive (SSD) comprising:
   a folded printed circuit board comprising: a first rigid portion; a second rigid portion;
   a first flexible region coupling the first rigid portion to the second rigid portion;
   a third rigid portion; a second flexible region coupling the second rigid portion to the third rigid portion; wherein the first rigid portion and the third rigid portion of the folded printed circuit board each have a width that is less than one half that of the second rigid portion; wherein the first rigid portion and the third rigid portion are positioned over the second rigid portion so that the first rigid portion and the third rigid portion do not overlap one another over the second rigid portion at any location orthogonal to the second rigid portion; and an enclosure into which the folded printed circuit board is positioned.

6. The SSD of claim 5, wherein a gap is located between the first rigid portion and the third rigid portion over the second rigid portion.

7. The SSD of claim 5, further comprising a plurality of memory chips positioned on each of the first rigid portion and the third rigid portion of the folded printed circuit board, and an SSD controller positioned on the second rigid portion of the folded printed circuit board.

8. The SSD of claim 5, wherein the first rigid portion and the third rigid portion are positioned along a common plane that is different than a plane the second rigid portion is positioned along.

9. The SSD of claim 5, wherein the first rigid portion and the third rigid portion of the folded printed circuit board are positioned directly over the second rigid portion.

10. A folded printed circuit board comprising: a first rigid portion; a second rigid portion; a first flexible region coupling the first rigid portion to the second rigid portion; a third rigid portion; a second flexible region coupling the second rigid portion to the third rigid portion; wherein the first rigid portion and the third rigid portion of the folded printed circuit board each have a width that is less than one half that of the second rigid portion; and wherein the first rigid portion and the third rigid portion are positioned over the second rigid portion so that the first rigid portion and the third rigid portion do not overlap one another over the second rigid portion at any location orthogonal to the second rigid portion.

11. The folded printed circuit board of claim 10, further comprising a plurality of memory chips positioned on each of the first rigid portion and the third rigid portion of the folded printed circuit board, and a solid state drive (SSD) controller positioned on the second rigid portion.

12. The folded printed circuit board of claim 10, wherein the first rigid portion and the third rigid portion are positioned along a common plane that is different than a plane the second rigid portion is positioned along.

13. The folded printed circuit board of claim 10, wherein a gap is located between the first rigid portion and the third rigid portion over the second rigid portion.

14. The folded printed circuit board of claim 10, wherein the first rigid portion and the third rigid portion are both positioned directly over the second rigid portion.

15. A method for forming an electronic device, comprising:
providing a printed circuit board including: a first rigid portion; a second rigid portion; a first flexible region coupling the first rigid portion to the second rigid portion; a third rigid portion; and a second flexible region coupling the second rigid portion to the third rigid portion; the first rigid portion and the third rigid portion each having a width that is less than one half that of the second rigid portion; folding the printed circuit board so that the first rigid portion and the third rigid portion are positioned over the second rigid portion so that the first rigid portion and the third rigid portion do not overlap one another over the second rigid portion at any location orthogonal to the second rigid portion; and positioning the folded printed circuit board into an enclosure.

16. The method of claim 15, further comprising providing a solid state drive (SSD) controller on the second rigid portion and a plurality of memory chips on the first rigid portion and the third rigid portion.

17. The method of claim 15, further comprising providing a gap between the first rigid portion and the second rigid portion over the second rigid portion.

18. The method of claim 15, wherein the folding the printed circuit board further includes positioning the first rigid portion and the third rigid portion directly over the second rigid portion.

19. The method of claim 15, further comprising positioning the first rigid portion and the third rigid portion along a common plane that is different than a plane the second rigid portion is positioned along.

* * * * *